United States Patent [19]

de Cremoux

[11] 4,218,692
[45] Aug. 19, 1980

[54] LIGHT-EMITTING AND LIGHT-RECEIVING DIODE PARTICULARLY FOR OPTICAL TELECOMMUNICATIONS

[75] Inventor: Baudouin de Cremoux, Paris, France

[73] Assignee: Thomson-CSF, Paris, France

[21] Appl. No.: 950,792

[22] Filed: Oct. 12, 1978

[30] Foreign Application Priority Data

Oct. 18, 1977 [FR] France ................. 77 31274

[51] Int. Cl.² .......................................... H01L 27/14
[52] U.S. Cl. ........................................ 357/19; 357/16; 357/17; 357/18; 357/58
[58] Field of Search ............... 357/19, 17, 18, 58, 357/16

[56] References Cited

U.S. PATENT DOCUMENTS

| | | | |
|---|---|---|---|
| 3,979,587 | 9/1976 | de Cremoux | 250/211 J |
| 4,068,252 | 1/1978 | Lebailly | 357/17 |
| 4,124,826 | 11/1978 | Dixon | 331/94.5 H |
| 4,138,274 | 2/1979 | Dyment | 148/1.5 |
| 4,152,713 | 5/1979 | Copeland | 357/19 |

FOREIGN PATENT DOCUMENTS 7523457  2/1977  France .

*Primary Examiner*—Martin H. Edlow
*Attorney, Agent, or Firm*—Cushman, Darby & Cushman

[57] ABSTRACT

A light-emitting and light receiving diode comprises an active zone which, in the emitting mode, is the seat of a strong current. The emission surface has a central semiconducting region which channels the current lines and an insulating region transparent to light. In the receiving mode, the photons pass through the entire receiving surface which is none other than the emission surface and the active zone has a sufficient thickness and a sufficiently low doping concentration to be in the space charge state.

7 Claims, 6 Drawing Figures

LIGHT-EMITTING AND LIGHT-RECEIVING DIODE PARTICULARLY FOR OPTICAL TELECOMMUNICATIONS

This invention relates to a single diode for both light-emission and light-detection for optical telecommunications.

The production of diodes of this type is particularly difficult, because the qualities required for operation as an electroluminescent diode on the one hand and as a photodetecting diode on the other hand require structure that is difficult to reconcile. Although various solutions have been proposed, the results obtained are often unsatisfactory.

The present invention relates to a diode which is both photoluminescent and photodetecting and which provides an interesting solution to this problem.

The light-emitting and light-detecting diode according to the invention comprises an active region sandwiched between two semiconducting zones and forming two heterojunctions with these zones.

The active zone of the diode is weakly doped and has a thickness sufficient to ensure correct operation in the detecting mode when a reverse bias is applied in that, on the other hand, in that the active surface of the diode consists of a central electrically conductive part and a peripheral insulating part, so that a d.c voltage applied to the diode in a forward direction may be sufficiently great for the density of the current in the active zone to be very high, for example of the order of $10^7$ amp/cc to enable photoemission.

The invention will be better understood from the following description in conjunction with the accompanying drawings, wherein.

Figure 1:
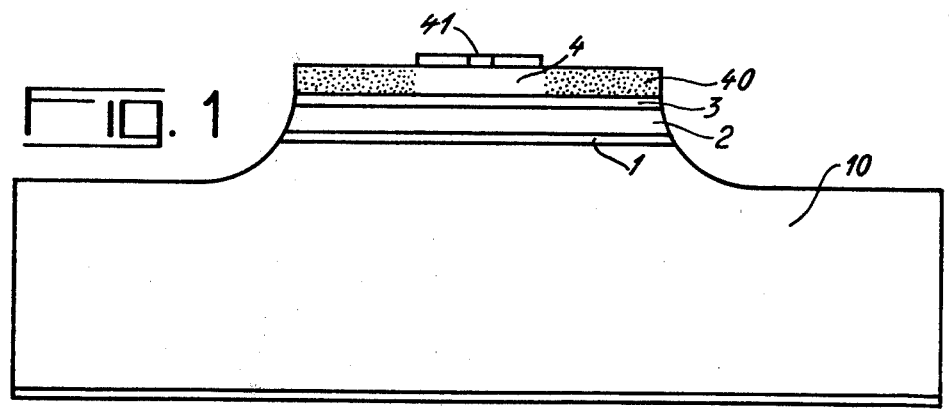

In FIG. 1, four layers 1, 2, 3, 4 have been formed in known manner by liquid-phase epitaxy on a substrate 10 of gallium arsenide (Ga As) of p-type conductivity doped with zinc in a concentration of $10^{18}$ at/cc. Of these four layers 1, 2, 3 and 4, the first two (1 and 2) are of p-type conductivity, but are less heavily doped than the substrate ($10^{16}$ to $10^{17}$ at/cc), whilst the second two layers 3 and 4 are of n-type conductivity and have a doping concentration of the order of $10^{17}$ at/cc. The chemical formulae of the epitaxial layers are combinations of the type $Ga_{1-x}, Al_x, As$, the value of x varying from one layer to the other, the effect of which is that all these layers have forbidden bands of different value. One of these layers, in the present case, the layer 2, has the forbidden bandwidth suitable for absorbing through backward biasing and for emitting through direct biassing light rays having a predetermined wavelength band, the other layers being transparent to these rays. The layer 4 has a region 40 at its periphery which has been subjected to proton bombardment and is thus insulating. Nevertheless, like the layer 3, it is transparent to the light rays of the predetermined band referred to above. A metallic contact 41 is formed on the layer 4.

Figure 2:
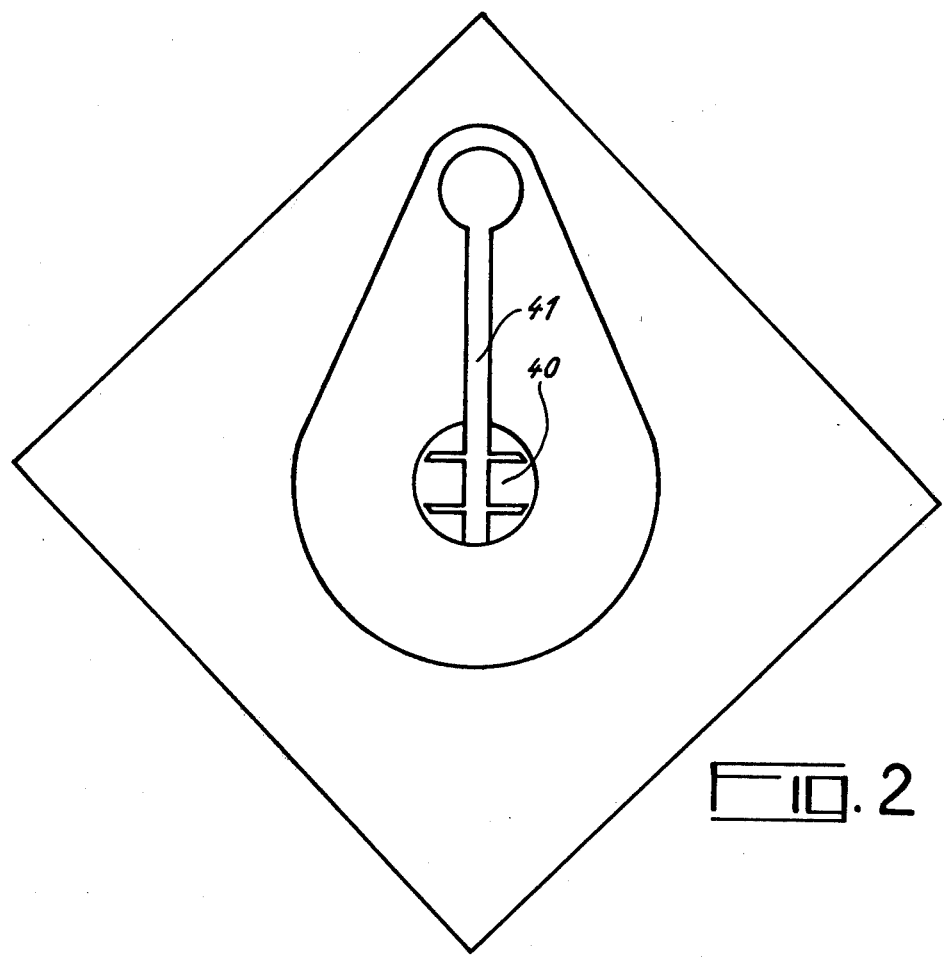
FIGS. 1 and 2 are respectively a section through and a plan view of a first embodiment of the invention.

The assembly is shown in plan view in FIG. 2. The central part of the zone 4 has a diameter of the order of 50 μm. The ohmic contact 41 may be formed by evaporation in vacuo and photoengraving process.

Figure 3:
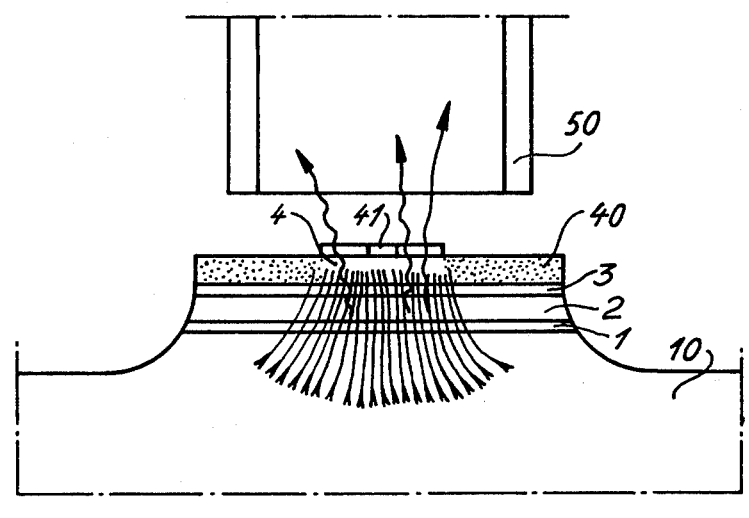
FIG. 3 is a section through the diode shown in FIG. 1 in the light-emitting diode.
Figure 4:
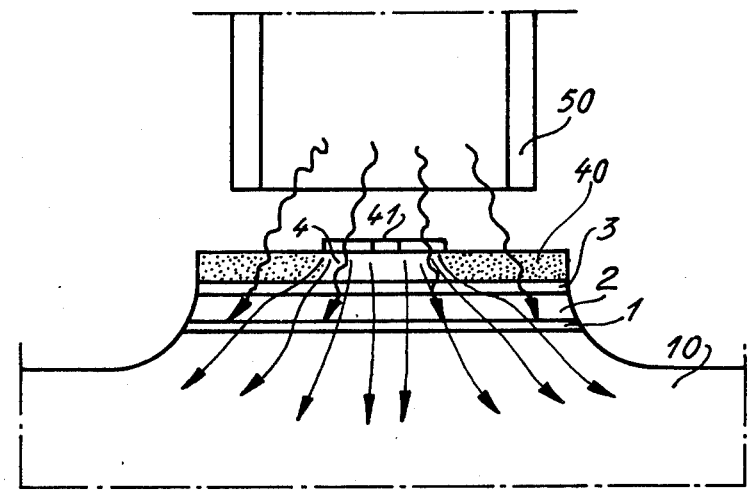
FIG. 4 is a section through the diode shown in FIG. 1 in the light-receiving mode.

The assembly has been subjected to a "mesa" attack and the contact which has the form illustrated may be connected to the d.c supply. The mode of operation of the assembly is illustrated in FIGS. 3 and 4.

(A) Emission mode (electroluminescent diode):

The diode is directly biased to deliver a current of from 50 to 100 mA. The layer 2, or active layer, is the seat of an intense electrical current (density per unit volume $10^7$ amp/cc). This compensates the weakness of its doping concentration which is of the order of $10^{17}$ at/cc. This current is concentrated in a confined region by virtue of the zone 40 which is highly resistive. The result of this is that photons are emitted solely in the central zone 4 which has a diameter of 50 μm for example. This diameter is sufficiently small for the light rays to be suitably collected by the optical fibre 50 situated above the surface 40.

Now, these qualities conflict with those required of a light-receiving diode of which the mode of operation will now be described.

(B) Receiving mode:

In this mode, the diode is biased by a voltage of 10 volts. According to the invention, the assembly formed by the zone 4 and the zone 40 is subjected to the light rays, allowing the photons to pass through by virtue of its transparency. The biassing of the order of 10 volts for a layer having an impurity concentration of the order of $10^{17}$ at/cc. and its thickness are such that it is at least partially in space charge or at least the diffusion length of the minority carriers is considerable. A current is produced by the exchange of holes and electrons. Since this current is of low intensity the presence of the high resistivity zones 40 will not be troublesome, and it is the entire active zone which will operate in the detection mode because the entire surface exposed to the light rays will contribute to the access of the photons to the active zone. Accordingly, the diode according to the invention will behave as two diodes, one emissive and of small diameter operating under the effect of a strong current and the other having a large receiving surface and an active layer of which the thickness and doping concentration are sufficient for the impact of the photons to create electron-hole pairs with sufficient strength to generate an electrical current.

The following Table shows by way of example the respective dimensions and compositions of the four epitaxial layers of a diode produced in accordance with the invention:

| number of layer | thickness | composition x | doping agent | free carriers per c.c. |
| --- | --- | --- | --- | --- |
| 1 | 1 μm | 0.3 | Ge | $10^{17}$ |
| 2 | 1 to 4 μm | 0.05 | Ge | $10^{16}$ to $10^{17}$ |
| 3 | 1 μm | 0.3 | Sn | $10^{17}$ |
| 4 | 4 μm | 0.1 | Te | $10^{18}$ |

In this Table, x defines the proportion of aluminum in the composition of each layer, the general formula being: $Ga_{1-x}, Al_x, As$. The wavelength of the light is of the order of 0.9 μm. The advantage of the diode according to the invention lies in the high value of its maximal global power ratio. This power ratio may be defined by the ratio of the current detected by a diode operating in the detection mode to the current injected into an identical diode functioning in the emitting mode and optically coupled with the first with a coupling coefficient equal to 1. In the diode according to the invention, this power is of the order of $10^{-3}$. Another characteristic is the global rise time, which may reach 20ns. Other semiconductor materials may be used, such as the quaternary system Ga, In, P, As and having the formula $Ga_{1-y}In_yAs_{1-z}P_z$ deposited on a substrate of indium phosphide. The layer 40 may be a simple dielectric layer. In addition, if the substrate is transparent, the diode may serve as principal component in an optical telecommunications line of the "bus" type.

Figure 5:
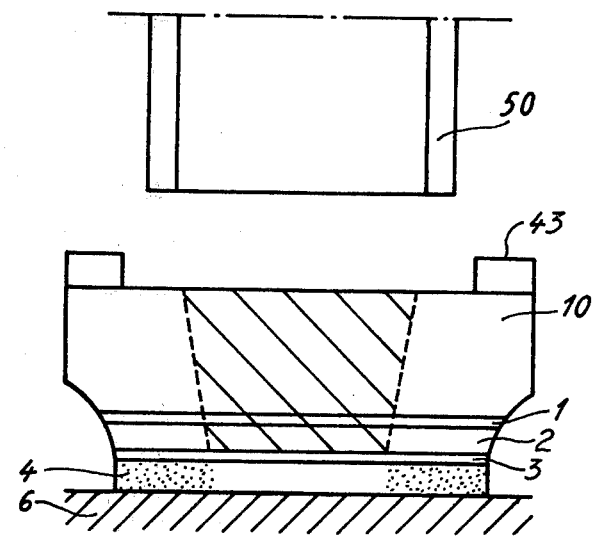
FIGS. 5 and 6 are respectively sections through second and third embodiments of the invention.

FIG. 5 is a section through another embodiment in which the substrate is transparent. For a wavelength of 1.1 $\mu$m, indium phosphide In P satisfies this condition.

The diode is welded upside down to a metallic contact 6. Since the metallic contact 6 is close to the junctions, it provides readily for dissipation of the heat of operation. The light rays enter or leave the substrate, depending on the mode of operation. In the emitting mode, if the thickness of the substrate is of the order of 50 $\mu$m and if its index is of the order of 4, it will be as if the light source was at most 50 $\mu$m from the emissive surface, which is the free face of the substrate. A contact 43 is formed on the substrate.

Figure 6:
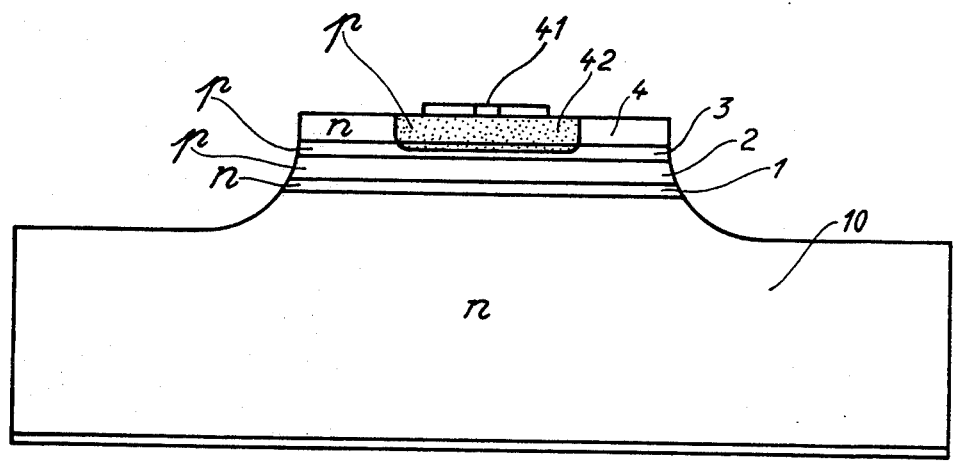

FIG. 6 shows one other embodiment, in which the zone 4a has a doping of n-type conductivity and forms a rectifying junction with the zone 3 of p-type conductivity.

In the central part of this zone there has been formed a diffusion 42 of which the depth is greater than that of the zone 4 and which therefore extends into the zone 3. This diffusion is of p-type conductivity.

In one particular example, the four layers 1, 2, 3 and 4, of which the parameters are summarized in the following Table, were deposited on an n-type substrate of Ga As doped with silicon in a concentration of $10^{18}$ at/cc:

| number of layer | thickness | x | type | doping agent | free carrier concentration at/cc |
| --- | --- | --- | --- | --- | --- |
| 1 | 1 $\mu$m | 0.3 | n | Sn | $10^{17}$ |
| 2 | 1 to 4$\mu$m | 0.05 | p | Ge | $10^{16}$–$10^{18}$ |
| 3 | 1 $\mu$m | 0.3 | p | Ge | $10^{17}$ |
| 4 | 4 $\mu$m | 0.1 | n | Sn | $10^{16}$ |

In this Table, x defines the formula $Ga_{1-x}Al_xAs$.

The diffusion of zinc is then formed by a masking process, in which the central region 4 is left exposed, and a heat treatment. The depth of diffusion is comprised between the thickness of the zone 4 and the sum of the thicknesses of the zones 3 and 4. Accordingly, in the central zone, the layer 3 is in contact with a zone having the same conductivity type whilst, in the peripheral zone, it is in contact with a layer having the opposite conductivity type.

In the event of direct biasing, the electrical current is blocked in the zone 4, the junction 4–3 being biased in the backward direction. Light is emitted solely in the region 4. In the event of backward biasing, the diode behaves in the same way as in the preceding examples.

What I claim is:

1. A diode for emitting and detecting light of predetermined wavelength, comprising:
   a substrate made of a semiconductor material having a first conductivity type;
   a first semiconductor layer having said first conductivity type, being doped less heavily than and being disposed on said substrate, said first layer having a forbidden band transparent to said light;
   a second layer, disposed on said first layer, made of a semiconductor material different from the semiconductor material of said first layer and being doped in said first conductivity type less heavily than said substrate, said second layer having a forbidden band suitable for absorbing and emitting said light of predetermined wavelength;
   a third layer disposed on said second layer, made of a semiconductor material different from the semiconductor material of said second layer, and doped in a second conductivity type opposite to said first conductivity type less heavily than said substrate, said third layer having a forbidden band having a different value than the forbidden band of said second layer, said third layer forbidden band being transparent to said light; and
   a fourth layer disposed on said third layer made of a semiconductor material different from the semiconductor materials of said second and third layers, and doped in said second conductivity type less heavily than said substrate, said fourth layer having a forbidden band of different value than said second and third layers, said fourth layer forbidden band being transparent to said light, said fourth layer including a central region and a peripheral region, said peripheral region having a greater resistance than said central region so that most of the current flowing through said fourth layer flows through said central region.

2. A diode for emitting and detecting light of predetermined wavelength comprising:
   a substrate made of a semiconductor material having a first conductivity type;
   a first semiconductor layer having said first conductivity type, being doped less heavily than and being disposed on said substrate, said first layer having a forbidden band transparent to said light;
   a second layer, disposed on said first layer, made of a semiconductor material different from said first layer and being doped in a second conductivity type opposite to said first conductivity type less heavily than said substrate, said second layer having a forbidden band suitable for absorbing and emitting said light of predetermined wavelength;
   a third layer disposed on said second layer, made of a semiconductor material different from the semiconductor material said second layer, and doped in said second conductivity type type less heavily than said substrate, said third layer having a forbidden band having a different value than the forbidden band of said second layer, said third layer forbidden band being transparent to said light; and
   a fourth layer disposed on said third layer, made of a semiconductor material different from the semiconductor materials of said second and third layers, and doped less heavily than said substrate, said fourth layer having a forbidden band of different value than said second and third layers, said fourth layer forbidden band being transparent to said light, said fourth layer including a central region and a peripheral region, said central region having said second conductivity type and said peripheral region having said first conductivity type.

3. A diode as claimed in claim 1, wherein said fourth layer peripheral region is rendered insulating by a previous protonic implantation.

4. A diode as claimed in claim 1, wherein the material of said first, second, third and fourth layers is:

$$Ga_{1-x}Al_xAs$$

wherein x for said second layer is different than x for the other layers and is between zero and 1.

5. A diode as claimed in claim 2, wherein the material of said first, second, third and fourth layers is:

$$Ga_{1-x}Al_xAs$$

wherein x for said second layer is different than x for the other layers and is between zero and 1.

6. A diode as claimed in claim 4, wherein said layers have the following composition:
p-doped $Ga_{0.7}Al_{0.3}As$ for the first layer;
p-doped $Ga_{0.95}Al_{0.05}As$ for the second layer;
n-doped $Ga_{0.7}Al_{0.3}As$ for the third layer;
n-doped $Ga_{0.9}Al_{0.1}As$ for the fourth layer
the structure of the diode having been submitted to a mesa etching.

7. A diode as claimed in claim 5, wherein said layers have the following composition:
n-doped $Ga_{0.7}Al_{0.3}As$ for the first layer;
p-doped $Ga_{0.95}Al_{0.05}As$ for the second layer;
p-doped $Ga_{0.7}Al_{0.3}As$ for the third layer and
$Ga_{0.9}Al_{0.1}As$ n-doped in the peripheral region of the fourth layer, and p-doped in the central region of the same, the structure of the diode having been submitted to a mesa etching.

* * * * *